(12) United States Patent
Fang

(10) Patent No.: US 6,820,329 B2
(45) Date of Patent: Nov. 23, 2004

(54) METHOD OF MANUFACTURING MULTI-CHIP STACKING PACKAGE

(75) Inventor: Jen-Kuang Fang, Kaoshiung (TW)

(73) Assignee: Advanced Semiconductor Engineering, Inc., Kaoshiung (TW)

(*) Notice: Subject to any disclaimer, the term of this patent is extended or adjusted under 35 U.S.C. 154(b) by 0 days.

(21) Appl. No.: 10/308,517

(22) Filed: Dec. 3, 2002

(65) Prior Publication Data

US 2003/0110625 A1 Jun. 19, 2003

(30) Foreign Application Priority Data

Dec. 14, 2001 (TW) .......................................... 90131083 A

(51) Int. Cl.[7] .................................................. H05K 3/34
(52) U.S. Cl. ...................... 29/840; 825/832; 228/234.1; 257/706
(58) Field of Search .......................... 29/825, 832, 840; 228/234.1; 257/706

(56) References Cited

U.S. PATENT DOCUMENTS

| | | | | |
|---|---|---|---|---|
| 5,634,268 A | * | 6/1997 | Dalal et al. | .................. 29/840 |
| 5,796,591 A | * | 8/1998 | Dalal et al. | .................. 361/779 |
| 5,821,624 A | * | 10/1998 | Pasch | .......................... 257/776 |
| 6,337,513 B1 | * | 1/2002 | Clevenger et al. | .......... 257/706 |
| 6,509,639 B1 | * | 1/2003 | Lin | .............................. 257/686 |
| 6,644,536 B2 | * | 11/2003 | Ratificar et al. | ......... 228/234.1 |

FOREIGN PATENT DOCUMENTS

| | | |
|---|---|---|
| TW | 426220 | 3/2001 |
| TW | 444463 | 7/2001 |

* cited by examiner

Primary Examiner—Carl J. Arbes
(74) Attorney, Agent, or Firm—Seyfarth Shaw LLP

(57) ABSTRACT

The present invention discloses a method of manufacturing a multi-chip stacking package. The characteristic of the invention is that after the alignment of the bumps of at least two chips, welded bumps will be generated in a high temperature welding to form a welded bump. Furthermore, one of the at least two chips may only provide bonding pad similar to the Under Bump Metallurgy and may not provide bumps, and using the bonding pad to be welded with the bump on another chip.

2 Claims, 4 Drawing Sheets

METHOD OF MANUFACTURING MULTI-CHIP STACKING PACKAGE

BACKGROUND OF THE INVENTION

1. Field of the Invention

The invention relates to a method of manufacturing a multi-chip stacking package, especially to a method of manufacturing multi-chip package using flip-chip bonding to complete the chip stacking.

2. Background of the Invention

Toward the increasing requirements for portability of electronic consumer products, undoubtedly the multi-chip module packaging technology is the best way to meet such requirements. However, the technologies for integrating the functions of many chips and reducing the area occupied by the package mostly need to stack the chips into a packaging device of 3-D structure.

FIG. 1 shows a cross-sectional schematic view of a conventional multi-chip stacking package 10, which is disclosed in the specification of Taiwan Patent Publication No. 444,364. The package 10 is characterized in that the active surface of the first chip 11 is welded to the upper surface of the substrate 15 with a plurality of bumps 13. Furthermore, the passive surface of a second chip 12 is attached to/onto the passive surface of the first chip 11. The upper surface of the active surface of the second chip 12 provides a plurality of wire bonding pads 17, which are connected to the wire bonding pads 17 and the bonding pads 18 of the substrate 15 through a plurality of metal bonding wires 14. The drawback of the package 10 in FIG. 1 is that the wire span of the metal bonding wire 14 is so long due to the connection from the wire bonding pad 17 of the second chip 12 to the bonding pad 18 of the substrate 15, such that a wire sway problem will rise easily and causes a short circuit during the process of encapsulation. Because the wire bonding process has a limitation for the height of wire arcs, it is necessary to keep a fixed space between the second chip 12 and the encapsulant 16, which results in a larger thickness of the package 10.

FIG. 2 shows another cross-sectional schematic view of the conventional multi-chip stacking package 20, which is disclosed in the specification of Taiwan Patent Publication No. 426,220. The package 20 attaches the passive surface of the first chip 11 onto the upper surface of the substrate 21 with the active surface of the first chip 11 facing upward. A second chip 12 is stacked and bonded with the first chip 11 by flip-chip bonding. The periphery of the active surface of the first chip 11 provides a plurality of wire bonding pads 25, which use a plurality of metal bonding wires 23 to connect with the bonding pads 18 on the substrate 21. The package 20 is superior to the package 10 in that the metal bonding wires 23 provide a shorter wire span and results in a higher yield. In addition, the structure of the package 20 is thinner and provides a better space applicability. However, in that prior patent specification, how to complete the flip-chip bonding for the two chips was not disclosed explicitly, and the structural characteristic of the combination part of the two chips was not presented in detail, either.

SUMMARY OF THE INVENTION

The first object of the invention is to provide a method for manufacturing a multi-chip stacking package so as to improve the production yield and production steps.

The second object of the invention is to provide a method of manufacturing a multi-chip stacking package with a low profile.

In order to achieve above-mentioned objects, the invention discloses a method of manufacturing multi-chip stacking package. The multi-chip stacking package uses at least two chips, which are bonded together and stacked by flip-chip technique, wherein the chip underneath is attached to/onto a substrate with glue. Each of the at least two chips has an active surface, and the active surface provides a plurality of bonding pads, in which the bonding pad is configured with Under Bump Metallurgy (UBM) and bumps based on the levels. The active surface of the chip underneath further provides a plurality of wire bonding pads on its periphery, and connects the wire bonding pads to the bonding pad of the substrate via the metal bonding wires. The whole package uses an encapsulant to protect the internal circuit and a plurality of solder balls are formed under the substrate so as to electrically connect to the circuit board. The characteristic of the invention is that after the alignment of the bumps of at least two chips, welded bumps will be generated in a high temperature welding to form a welded bump. Furthermore, one of the at least two chips may only provide a bonding pad similar to the Under Bump Metallurgy 43 and may not provide with bumps, and using the bonding pad to be welded with the bump on another chip.

BRIEF DESCRIPTION OF THE DRAWINGS

The invention will be described according to the appended drawings, in which.

DESCRIPTION OF PREFERRED EMBODIMENTS

Figure 1:
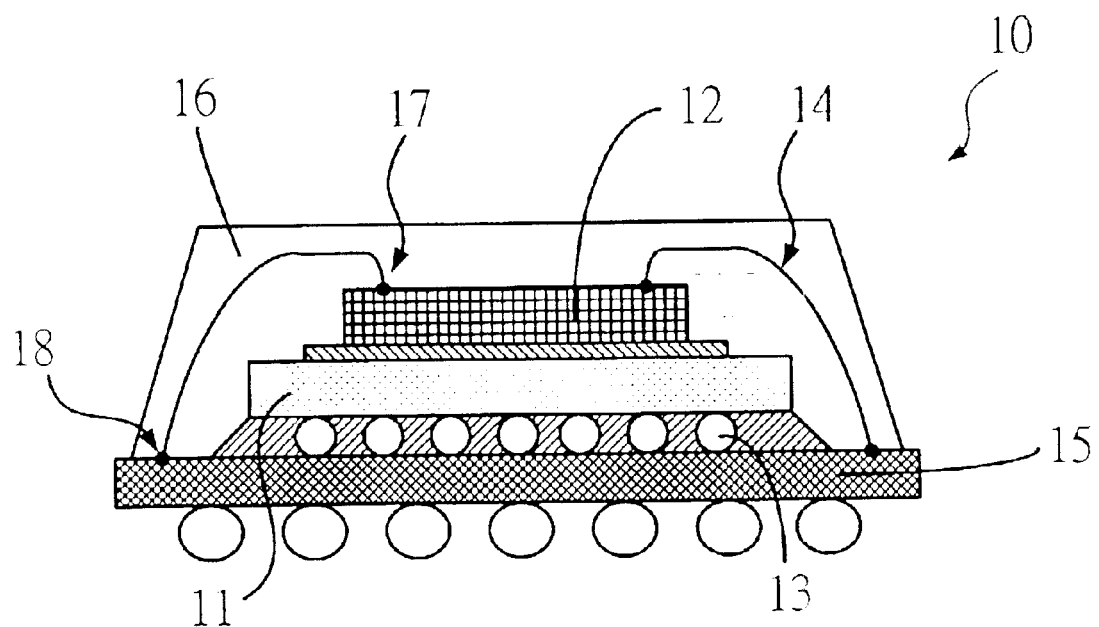
FIG. 1 shows a cross-sectional diagram of a prior multi-chip package.
Figure 2:
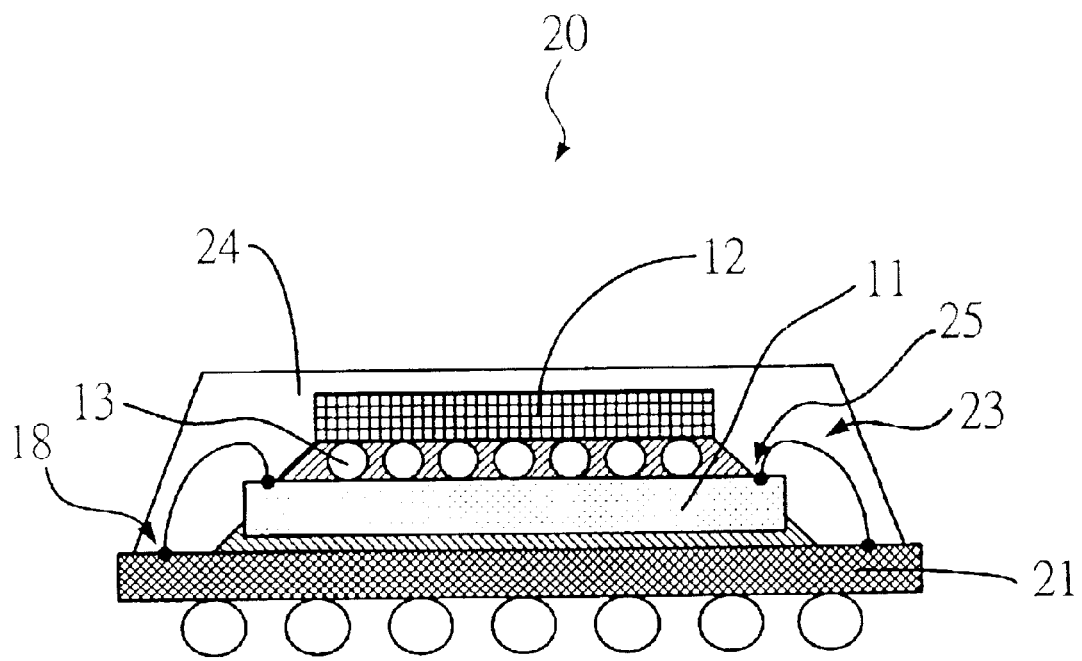
FIG. 2 shows another cross-sectional diagram of a prior multi-chip package.
Figure 3:
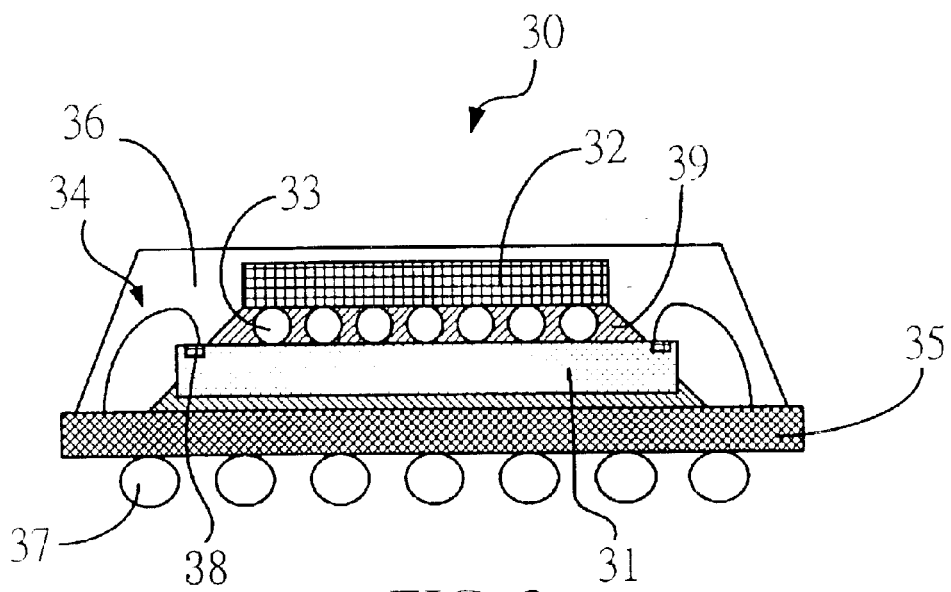
FIG. 3 shows a schematic diagram of a first embodiment of a multi-chip package according to the invention.

FIG. 3 shows a schematic view of the multi-chip stack package 30 according to one preferred embodiment of the invention. The multi-chip stack package 30 includes a first chip 31, a second chip 32, a substrate 35 and a plurality of solder balls 37. The first chip 31 and second chip 32 are bonded by welded bumps 33 via flip-chip bonding, and the first chip 31 is attached to/onto the upper surface of the substrate 35 with adhesive. A plurality of wire bonding pads 38 are configured on the periphery of the active surface of the first chip 31 and are not covered by the underfill 39 surrounding the welded bump. The wire bonding pads 38 can achieve the electrical signal connection via the metal bonding wires 34 and the substrate 35. The multi-chip stacking structure on the upper surface of the substrate 35 is protected by the covering of the encapsulant 36, and the lower surface of the substrate 35 provides a plurality of solder balls 37 as electrical contacts with the circuit board (not shown).

Figure 4:
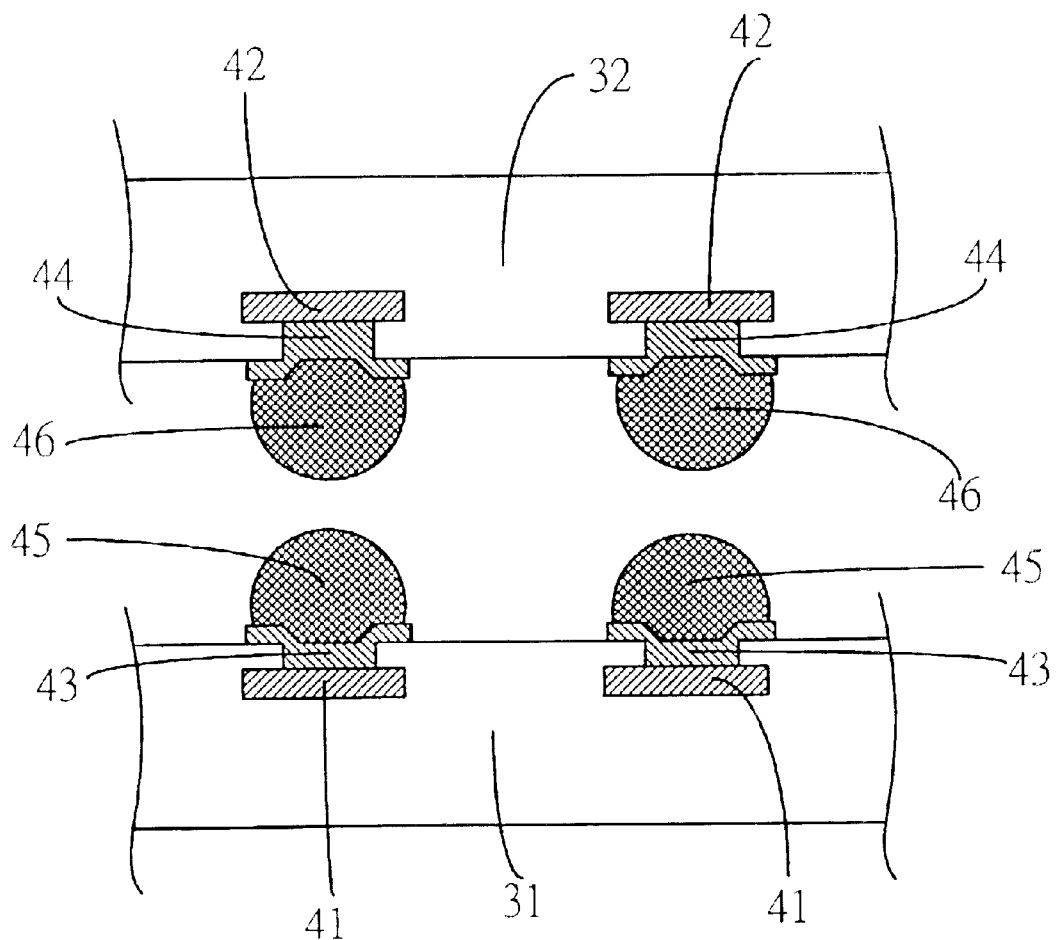
FIG. 4 shows a decomposition diagram of a first embodiment of a flip-chip bonding according to the invention.

FIG. 4 shows a decomposed schematic view of the flip-chip bonding structure according to one preferred embodiment of the invention. The first chip 31 and the second chip 32 provide an active surface containing circuit traces and a passive surface opposite to the active surface, respectively. The active surface of the first chip 31 provides a plurality of first bonding pads 41, the surface of which is formed sequentially with the first Under Bump Metallurgy 43 and a first bump 45. The first Under Bump Metallurgy 43 is formed on the first bonding pad 41 by sputtering various metals in layers. The active surface of the second chip 32 also provides a plurality of second Under Bump Metallurgies 44, and the surface of each second Under Bump Metallurgy 44 is configured with a second bump 46. The two chips are bonded by flip-chip bonding, that is, after the first bump 45 and the second bump 46 are aligned and stacked, and by applying heat and pressure to completely weld the upper and lower bumps together to form the welded bumps 33.

Figure 5:
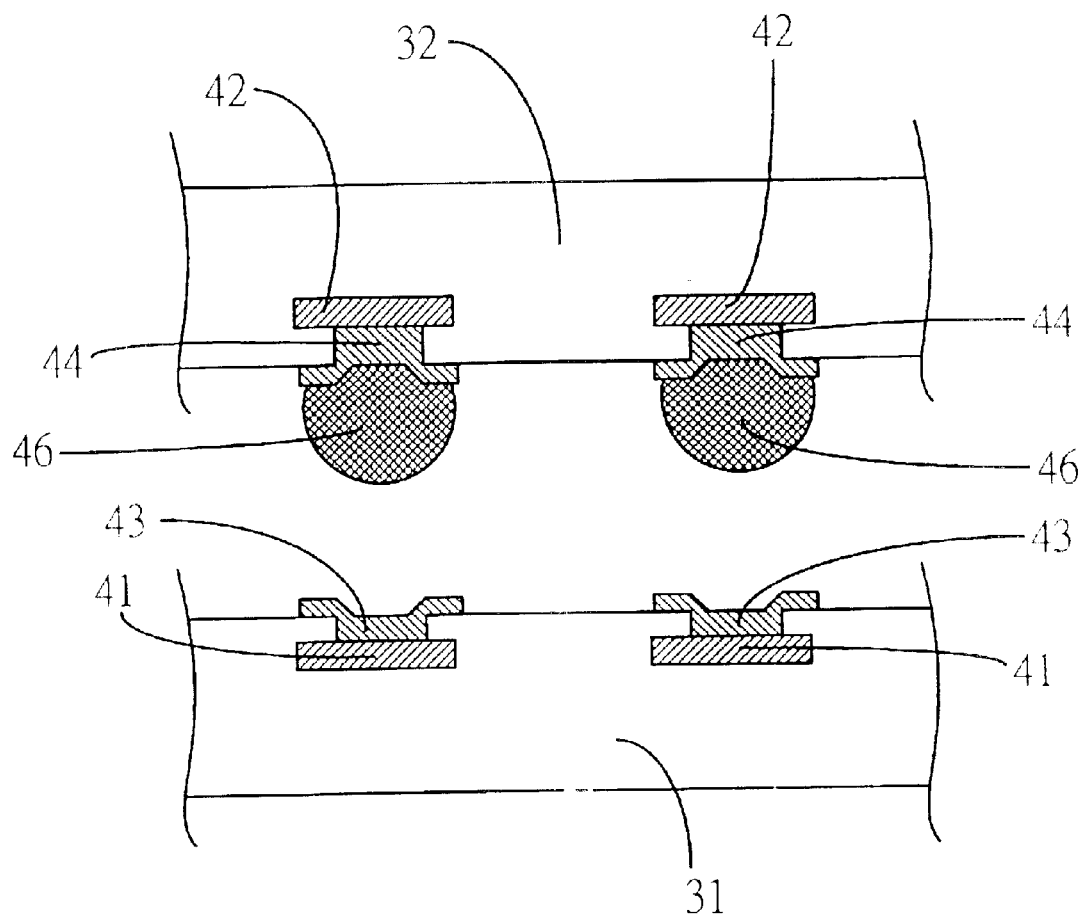
FIG. 5 shows a decomposition diagram of a second embodiment of a flip-chip bonding according to the invention.

FIG. 5 shows an exploded schematic view of the flip-chip bonding structure according to another preferred embodiment of the invention. The first bonding pad 41 of the first chip 31 may only provide the first Under Bump Metallurgies 43, and the second chip 32 still provides the second Under Bump Metallurgies 44 and the second bumps 46. The flip-chip bonding structure is obtained by aligning and stacking the second bumps 46 and the first Under Bump Metallurgies 43, thereafter by applying heat and pressure to completely weld the second bump 46 and the first Under Bump Metallurgy 43 together to form the welded bump 33.

Figure 6:
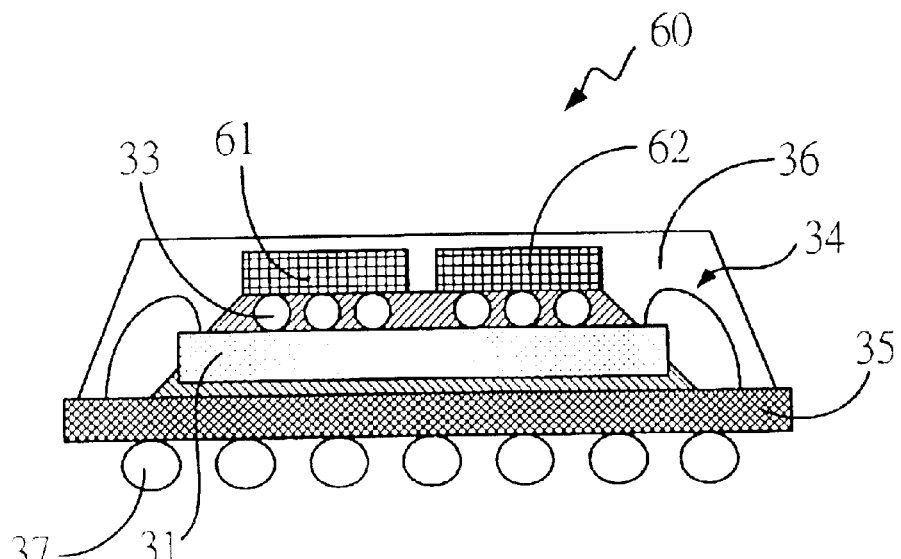
FIG. 6 shows a schematic diagram of a second embodiment of a multi-chip package according to the invention.
Figure 7:
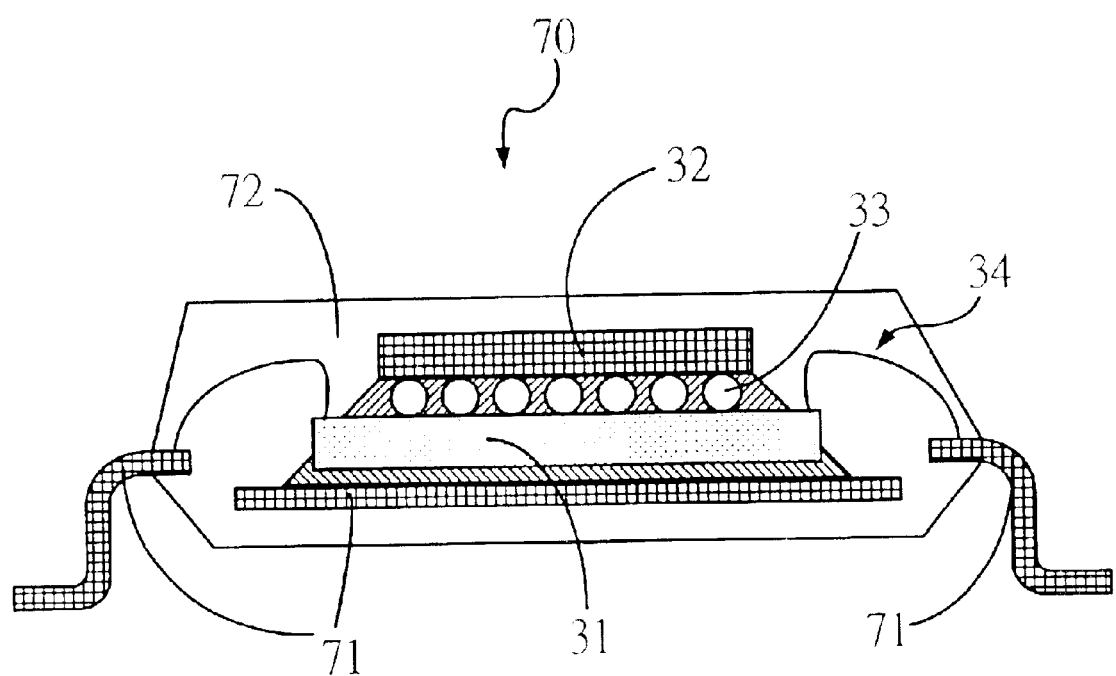
FIG. 7 shows a schematic diagram of a third embodiment of a multi-chip package according to the invention.

All the described embodiments use the package of two chips, but it is also possible to replace the second chip 32 with a stack of the above two chips, which depends on the specification requirement and the functions of the chip to change the package design. FIG. 6 shows a cross-sectional diagram of the second embodiment of the multi-chip stacking package. The second chip 32 on the upper layer is replaced with the third chip 61 and the fourth chip 62. The chips on the upper and lower layers can complete the stack package 60 using the flip-chip bonding method in the invention. The package of the invention uses the substrate 35 to affix multiple chips, and also use the leadframe 71 as the carrier. The transfer molding operation may be used to achieve the protection structure of the encapsulant 72 of the package 70, as shown in FIG. 7.

The above-described embodiments of the present invention are intended to be illustrative only. Numerous alternative embodiments may be devised by those persons skilled in the art without departing from the scope of the following claims.

What is claimed is:

1. A method of manufacturing a multi-chip stacking package, comprising the steps of:

forming under bump metallurgies and bumps on a plurality of bonding pads of a first chip and a second chip;

aligning and contacting bumps of said first chip with corresponding bumps of said second chip;

combining bumps of said first chip with the corresponding bumps of said second chip to form welded bumps;

forming under bump metallurgies and bumps on a plurality of bonding pad of a third chip, which is parallel to said second chip;

aligning and contacting bumps of said first chip with corresponding bumps of said third chip; and combining bumps of said first chip with the corresponding bumps of said third chip to form welded bumps.

2. A method of manufacturing a multi-chip stacking package, comprising the steps of:

forming under bump metallurgies on a plurality of bonding pads of a first chip and forming under bump metallurgies and bumps on a plurality of bonding pads of a second chip;

aligning and contacting under bump metallurgies of said first chip with corresponding bumps of said second chip;

combining under bump metallurgies of said first chip with the corresponding bumps of said second chip;

forming under bump metallurgies and bumps on a plurality of bonding pad of a third chip, which is parallel to said second chip;

aligning and contacting bumps of said first chip with the corresponding bumps of said third chip; and combining bumps of said first chip with corresponding bumps of said third chip by applying heat and pressure.

* * * * *